(12) United States Patent
Chung (10) Patent No.: US 6,448,803 B1
(45) Date of Patent: Sep. 10, 2002

(54) TEST SOCKET

(76) Inventor: Un-Young Chung, 345-2, Buhang-Ri, Shilchon-Myeon, Kwangju-Kun, Kyungki-Do (KR)

( * ) Notice: Subject to any disclaimer, the term of this patent is extended or adjusted under 35 U.S.C. 154(b) by 0 days.

(21) Appl. No.: 09/554,568

(22) PCT Filed: Oct. 8, 1999

(86) PCT No.: PCT/KR99/00606

§ 371 (c)(1),
(2), (4) Date: May 16, 2000

(87) PCT Pub. No.: WO00/22445

PCT Pub. Date: Apr. 20, 2000

(30) Foreign Application Priority Data

| Oct. 10, 1998 | (KR) | ......................... 98-19351 U |
| Nov. 25, 1998 | (KR) | ......................... 98-23017 U |
| Nov. 25, 1998 | (KR) | ......................... 98-23018 U |
| May 21, 1999 | (KR) | ......................... 99-8830 U |

(51) Int. Cl.$^7$ ..................... G01R 31/26; G01R 31/02
(52) U.S. Cl. ..................... 324/765; 324/760
(58) Field of Search ................ 324/765, 760, 324/754, 158.1; 439/70, 71, 331, 330, 73, 66

(56) References Cited

U.S. PATENT DOCUMENTS

| 4,547,031 A | * | 10/1985 | Korsunsky | .................. 439/331 |
| 4,735,580 A | | 4/1988 | Hansen et al. | |
| 4,846,704 A | * | 7/1989 | Ikeya | ......................... 439/72 |
| 4,962,356 A | | 10/1990 | Eberlein et al. | |
| 5,069,629 A | * | 12/1991 | Johnson | ......................... 439/66 |
| 5,306,167 A | * | 4/1994 | Nagumo | ...................... 439/331 |
| 5,388,996 A | | 2/1995 | Johnson et al. | |
| 5,557,212 A | | 9/1996 | Isaac et al. | |
| 5,634,801 A | * | 6/1997 | Johnson | ......................... 439/71 |
| 5,742,171 A | | 4/1998 | Matsunaga et al. | |
| 5,847,572 A | | 12/1998 | Iwasaki et al. | |
| 5,967,848 A | * | 10/1999 | Johnson et al. | ................ 439/66 |

* cited by examiner

Primary Examiner—Michael Sherry
Assistant Examiner—Jermele Hollington
(74) Attorney, Agent, or Firm—Cohen, Pontani, Lieberman & Pavane

(57) ABSTRACT

A test socket structure in which a contact pin of a defective socket is replaced by block unit, and a pattern of a printed circuit board of a testing equipment is not abraded during testing of a semiconductor device. A fabricating method of a contact pin is disclosed by which the contact pin is hardly deformed and its spring elastic force can be maintained for a long time. Test socket including: a first housing (51) made of an insulating material having a predetermined thickness; a second housing (52) made of an insulating material, a side wall of which is adjacent to a side wall of the first housing; a first (53) and a second elastomers (54) respectively installed at an upper and a lower surfaces of the second housing; and a contact pin block (55) having a plurality of contact pins arranged at predetermined pitches and a fixing unit (55b) for fixing the plurality of contact pins so that they can be moved together, wherein the contact pin block is insertedly installed between the first and the second housings and is contacted with the first and the second elastomers in the vicinity of both end portions of the contact pin.

18 Claims, 11 Drawing Sheets

000
TEST SOCKET

TECHNICAL FIELD

The present invention relates to an electric connection structure between an integrated circuit (IC) device and a printed circuit board, and in particular, to a structure of a test socket for testing an integrated circuit.

BACKGROUND ART

An integrated circuit fabricated through complicated processes is subject to various electric tests for a characteristics measurement or quality inspection. In this respect, a socket is frequently used in order to electrically connect a test circuit of a printed circuit board installed at a test equipment to an external terminal (outer lead) of the IC device. That is, for testing the IC device, the socket serves as an interface for electrically connecting the printed circuit board of the test equipment and an IC device.

A conventional test socket structure will now be described with reference to accompanying drawings.

Figure 1:
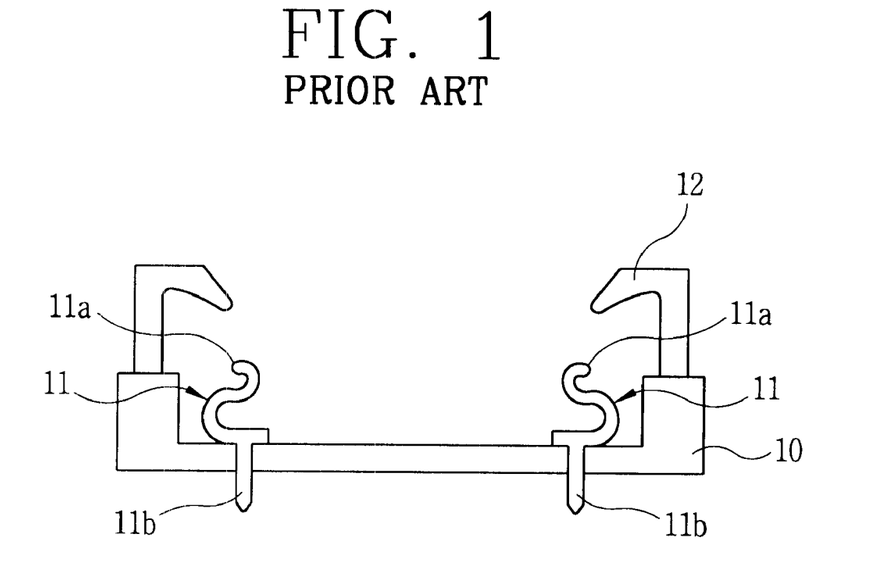
FIG. 1 is a longitudinal-sectional view of a conventional test socket.

Generally, as shown in FIG. 1, a test socket of an IC device includes a socket housing 10 and a plurality of contact fingers (contact terminals) 11. The contact finger is formed curved in a semicircle shape so as to have a spring elastic force by a downward pressing pressure. Reference numeral 12 denotes a fixing pin for fixing the IC device so that the electrical connection between the contact finger and the outer lead of the semiconductor device is not be unstable while the IC device is being tested.

Figure 2:
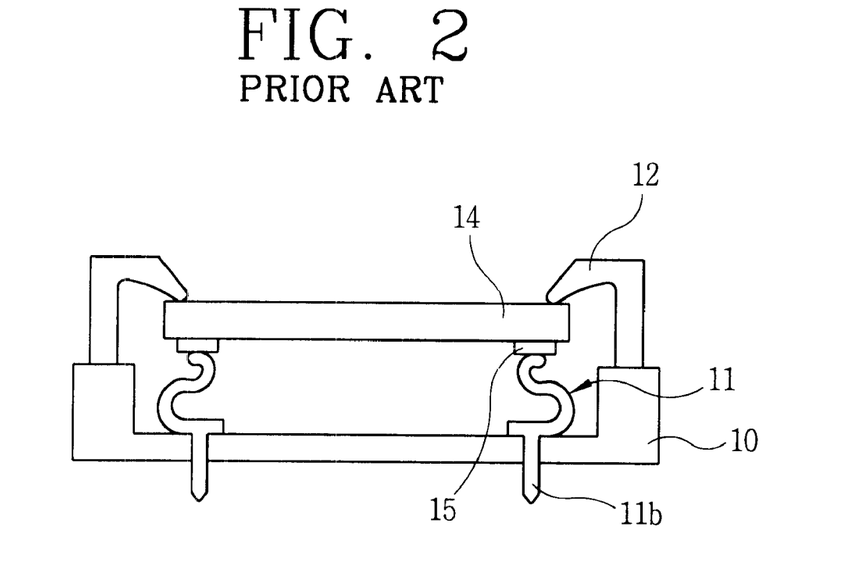
FIG. 2 shows a device under test mounted on the test socket of FIG. 1.

FIG. 2 shows a device under test (DUT) 14 as mounted on the socket. The device under test 14 is mounted on the socket in a manner that an outer lead 15 of the device under test 14 is contacted by an upper terminal 11a of the contact finger 11. For performing the test, the lower terminal 11b of the contact finger 11 is mounted to be necessarily contacted on a printed circuit (not shown) of the printed circuit board of the test equipment.

Thereafter, the device under test 14 is pressed down by a pressing unit (not shown), so that the outer lead of the device under test and the upper terminal 11a of the contact pin of the socket are electrically connected by the press-down contact, and the lower terminal 11b of the contact pin and a circuit pattern (not shown) formed on the surface of the board of the test equipment are also electrically connected by the press-down contact.

The device pressing unit (not shown) renders the overall outer leads of the device under test mounted on the socket to be contacted to the upper terminal of the contact fingers, and at this time, the downward pressure has a great value. Accordingly, if such a strong downward pressure is applied thereto in every testing, the frequency of the testing becomes higher, resulting in that the spring elastic force of the contact finger of the socket is deteriorated or there possibly occurs difference in spring elastic force with respect to each contact finger.

With those problem occurring, eventually, a contact finger having a weakened spring elastic force among the plural contact fingers would cause a contact inferiority or a contact instability over such connection between the device under test and the external terminal, even though the device under test is pressed down by the pressing pressure.

Such a contact finger having the weakened spring elastic force must be replaced by a new normal one. In this respect, in case of a socket having the contact finger and the socket housing as an incorporated one, even if there occurs a contact deterioration or contact instability for a single contact finger, the high-priced socket itself needs to be replaced by a new one, which inevitably incurs a heavy expense for testing with a prodigal waste.

In order to resolve such a problem, the U.S. Pat. No. 5,634,801 discloses a test socket having a structure that a defective contact pin is individually replaced, as illustrated in FIGS. 3A and 3B, details of which will now be described.

Figure 3A:
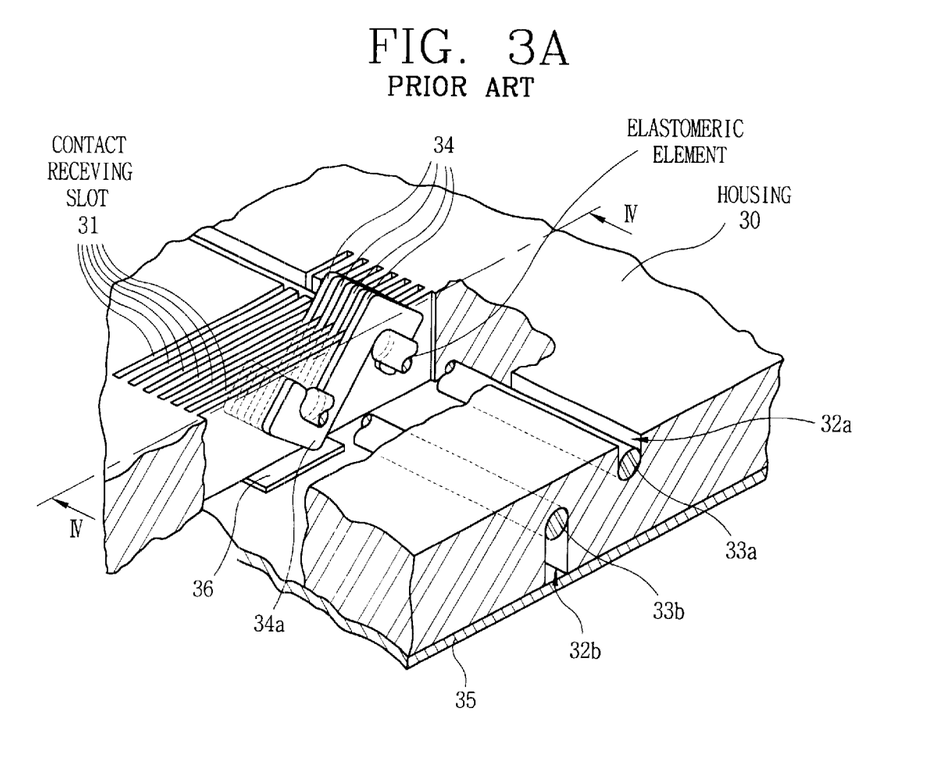
FIG. 3A is an outer perspective view a test socket in accordance with another embodiment of the conventional art.
Figure 3B:
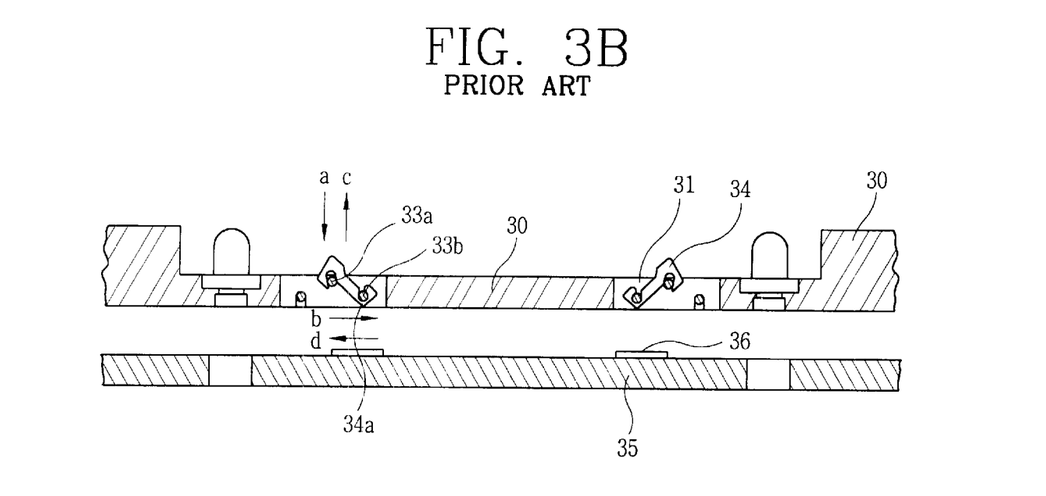
FIG. 3B is a longitudinal-sectional view of the test socket taken along line IV—IV.

The socket shown in FIG. 3A includes a housing 30, a plurality of contact pin receiving slots 31 each arranged in parallel at predetermined intervals within the housing 30, an upper and a lower cavities 32a and 32b each formed at an upper surface and a lower surface of the housing. The upper cavity 32a formed at the upper surface of the housing 30 and the lower cavity 32b formed at the lower surface of the housing 30 are positioned at marginal portions in mutually opposite side of the slot.

Elastomer 33a and 33b are respectively installed within the upper and lower cavities 32a and 32b. Inside each of the contact pin receiving slot 31, S-shaped contact pins 34 are respectively inserted, of which an upper end portion and a lower end portion are respectively rested on the elastomers.

Reference numeral 35 denotes a printed circuit board of the test equipment, and reference numeral 36 denotes a circuit pattern formed on the printed circuit board, which is connected to the lower surface of the contact pin 34.

FIG. 3B is a longitudinal-sectional view taken along line IV—IV of FIG. 3A.

As described above, the conventional socket has an advantage in that since each contact pin 34 is individually installed in each contact pin receiving slot 31, any defective contact pin can be replaced by a normal one whenever it occurs.

Nevertheless, it also has disadvantages in the following aspects.

First, in case that plural contact pins 34 are defective, each contact pin should be replaced one by one, causing inconvenience and taking much time for replacing the contact pins.

Secondly, in order to perform testing, when the IC device (not shown) is pressed downwardly ('a' direction) as is mounted on the upper portion of the contact pin, the lower surface portion 34a of the contact pin 34 moves in the horizontal direction to the circuit pattern, that is, in a 'b' direction toward inside the socket, while being contacted with the circuit pattern 36 of the printed circuit board.

In addition, after finishing the testing, when the semiconductor device is raised upward ('c' direction), the lower surface portion 34a of the contact pin 34 moves in the horizontal direction, that is, 'd' direction opposite to the 'b' direction.

Accordingly, if the testing of the semiconductor device is repeatedly done, the lower surface portion 34a of the contact pin 34 always contacts the circuit pattern 36 whenever it moves in the 'b' and 'd' directions. Consequently, repeated movement of the lower surface portion 34a causes an abrasion on the part of the circuit pattern 36 where the contact pin is continuously contacted thereto, creating a problem of deterioration on the printed circuit board of the high-priced test equipment.

Fabricating method of the contact pin or the contact finger of the conventional test socket is as follows.

Figure 4A:
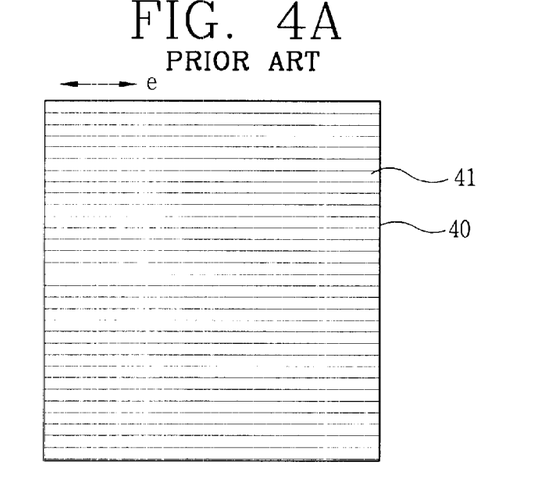
FIGS. 4A through 4C sequentially shows the order of fabricating process of a contact pin of a test socket in the conventional art.
Figure 4B:
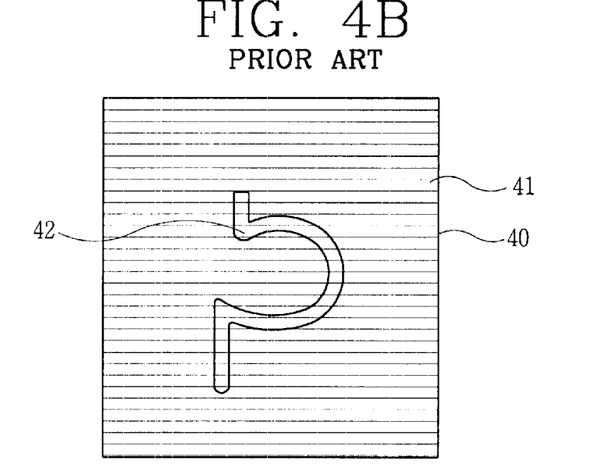
Figure 4C:
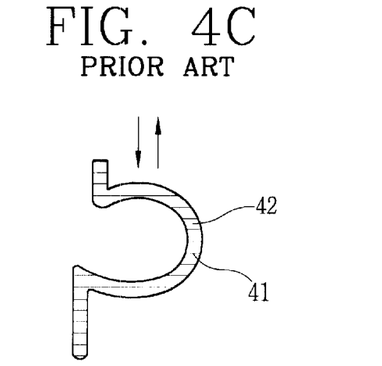

As shown in FIG. 4A, a metal plate 40 having straight grains 41 in one direction is formed by extrusion molding. And, As shown in FIG. 4B, a contact pin or contact finger 42 in patterns such as 'C'-shape or 'S'-shape is drawn. And then, as shown in FIG. 4C, a pattern shaped in a contact finger is cut out therefrom, to thereby form a contact finger 42.

In this respect, however, the contact finger made by that method is easily broken along the metal grains during the testing, as up and down movement is repeated by hundreds and thousands of times.

In addition, as the movement in the direction perpendicular to the direction of the metal grain is repeated, its spring elastic force is weakened, so that the contact finger is easily deformed, resulting in that a durability of the socket is shortened.

DISCLOSURE OF THE INVENTION

Therefore, it is an object of the present invention to provide a test socket structure in which a contact pin of a defective socket is replaced by block unit.

Another object of the present invention is to provide a test socket structure in which a pattern of a printed circuit board of a testing equipment is not abraded during testing of a semiconductor device.

Still another object of the present invention is to provide a test socket in which an elastomer is installed at a portion where an end portion of a contact pin contacts a socket housing so as to successively maintain a spring elastic force at the end portion of the contact pin, thereby lengthening a durability of the contact pin, and height deviation of each contact pin is reduced, so that a reliability in an electrical connection between the contact pin and an outer lead of a device under test is obtained.

Yet another object of the present invention is to provide a fabricating method of a contact pin by which the contact pin is hardly deformed and its spring elastic force can be maintained for a long time.

Also, another object of the present invention is to provide a fabricating method of a contact pin for a test socket for which a metal strip cut in a metal grain direction over metal plate is bent or curved in a direction perpendicular to the metal grain direction, so that a socket pin has a strong spring elastic force and is not easily deformed or not easily fatigued.

To achieve these and other advantages and in accordance with the purpose of the present invention, as embodied and broadly described herein, there is provided a test socket including: a first housing made of an insulating material having a predetermined thickness; a second housing made of an insulating material, a side wall of which is adjacent to a side wall of the first housing; a first and a second elastomers respectively installed at an upper and a lower surfaces of the second housing; and a contact pin block having a plurality of contact pins arranged at predetermined pitches and a fixing unit for fixing the plurality of contact pins so that they can be moved together, wherein the contact pin block is insertedly installed between the first and the second housings and is contacted with the first and the second elastomers in the vicinity of both end portions of the contact pin.

The first housing of the test socket of the present invention is the insulating material having an opening at its central portion, while the second housing is an insulating plug insertedly installed at the opening of the first housing.

There is also provided a test socket in accordance with another embodiment of the present invention including: a first housing made of an insulating material having a slit at the central portion of its upper surface and a receiving recess at the central portion of its lower surface; a left supporting unit and right supporting unit respectively insertedly installed within the receiving recess of the first housing; a first elastomer protrusively installed both at a side wall of the left supporting unit and at a side wall of the right supporting unit; a left contact pin block supported by the side wall of the left supporting unit; and a right contact pin block supported by the side wall of the right supporting unit, wherein the left contact pin block and the right contact pin block have respectively at least one bent portion, the contact pins are bent outwardly of each side wall of the left supporting unit and the right supporting unit, and the bent portion of the left contact pin block and that of the right contact pin block are closed to each other.

In order to attain the object of the present invention, there is provided a test socket including: a first housing made of an insulating material having a slit at the central portion of its upper surface and a receiving recess at the central portion of its lower surface; a right supporting unit and left supporting unit respectively insertedly installed within the receiving slot of the first housing; a first and a second elastomers respectively protrusively installed at an upper side and a lower side of each side wall at a predetermined interval; a left contact pin block supported by the side wall of the left supporting unit; and a right contact pin block supported by the side wall of the right supporting unit, wherein the left contact block and the right contact block have two convex bent portions formed convexly in the distanced direction from the side wall and a concave bent portion formed between the convex bent portions and bent in the adjacent direction to the side wall of the supporting unit, and each convex bent portion of the left contact pin block and the right contact pin block closes to each other.

In order to attain the object of the present invention, there is also provided a fabricating method of contact pin block of a test socket including the steps of: preparing a metal plate extrusion molded so as to have grains in a constant direction thereon; cutting the metal plate in the grain direction to form a metal strip; bending or curving the metal strip in a direction perpendicular to the grains to make a contact pin for socket; and arranging the plurality of contact pins at constant pitches and attaching an insulating tape onto one side or both sides of the contact pin to thereby form a contact book.

MODES FOR CARRYING OUT THE PREFERRED EMBODIMENTS

Various embodiments of socket structures in accordance with the present invention will now be described with reference to the accompanying drawings.

A test socket structure for testing a semiconductor device sealed in a package in a QFP (quad flat package) type in accordance with a first embodiment of the present invention will now be described with reference to FIGS. 5A through 5C.

Figure 5A:
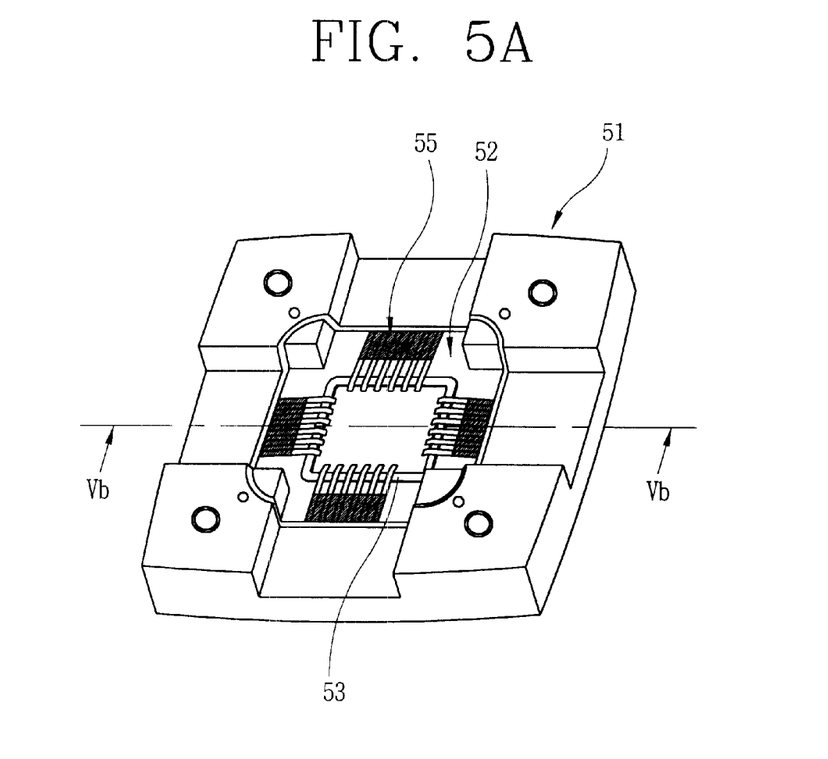
FIG. 5A is an outer perspective view of a test socket in accordance with a first embodiment of the present invention.
Figure 5B:
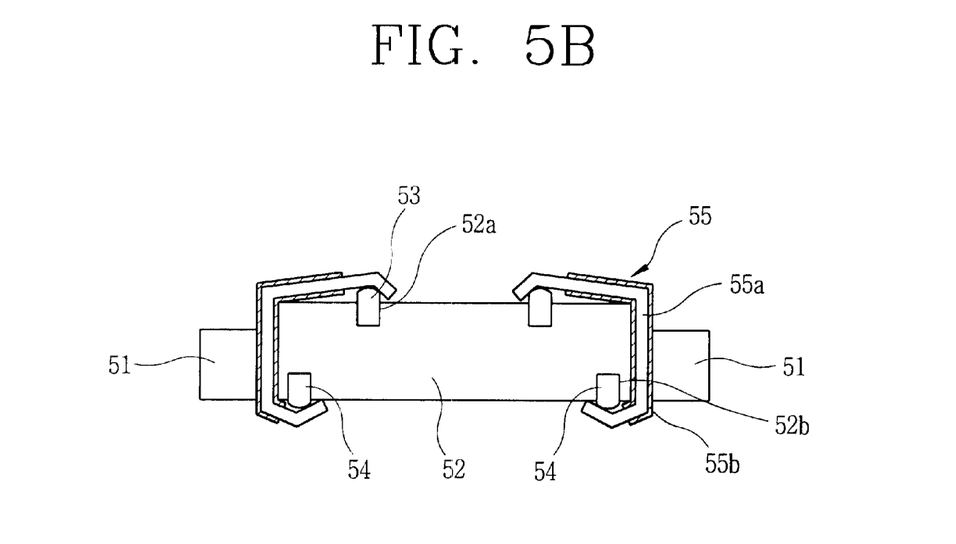
FIG. 5B is a longitudinal-sectional view of the test socket taken along line Vb—Vb of FIG. 5A in accordance with the present invention.
Figure 5C:
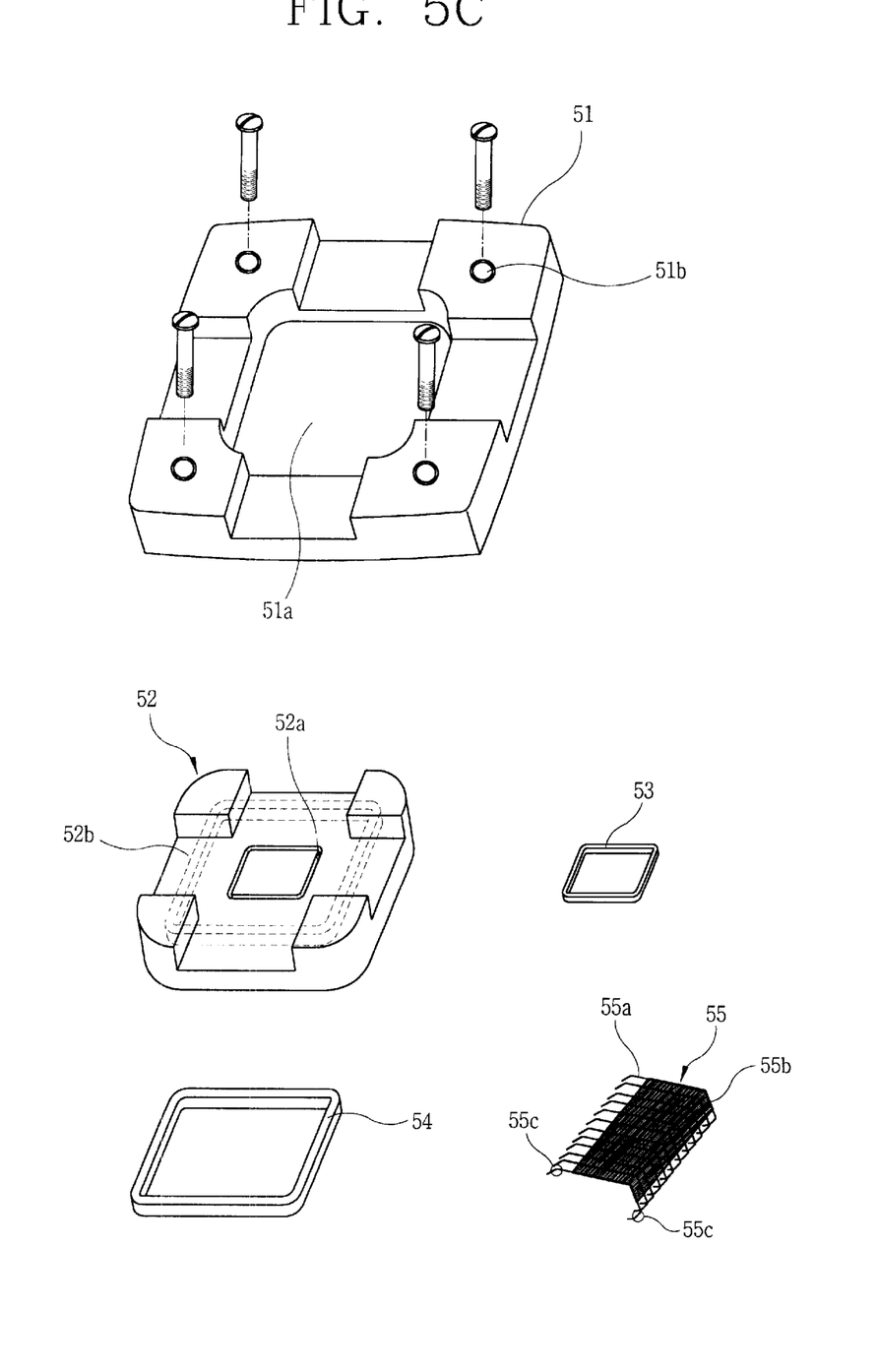
FIG. 5C is a disassembled perspective view of the test socket of FIG. 5A in accordance with the present invention.

FIG. 5A is an outer perspective view of a test socket in accordance with a first embodiment of the present invention; FIG. 5B is a longitudinal-sectional view of the test socket taken along line Vb—Vb of FIG. 5A in accordance with the present invention; and FIG. 5C is a disassembled perspective view of the test socket of FIG. 5A in accordance with the present invention.

A test socket in accordance with a first embodiment of the present invention includes a first housing 51 made of an insulating material having an opening 51 a at its central portion; and a second housing 52 (or an insulating plug) made of an insulating material insertedly mounted in the opening 51a of the first housing.

Around the four corners, thread grooves 51b are formed for fixing a socket to a printed circuit board where a test circuit is formed. Since the test socket is directly fixed onto the printed circuit board of a test equipment by using the thread grooves 51b, a lower end portion of a contact pin of the socket and a circuit pattern of the printed circuit board are fixedly attached to each other, having a good reliability in connection and a low contact resistance.

In addition, unlike in the conventional art, the socket contact pin and the printed circuit board of the test equipment are directly connected without inserting a socket board therebetween, so that an electrical connection path between an outer lead of the device under test and the circuit pattern of the printed circuit board is shortened, which is suitable for testing of a high-frequency semiconductor device. Moreover, during testing, a stability in its connection can be guaranteed even for such a mechanic movement that the package is mounted and dismounted.

The second housing 52 has a moat-shaped first and second cavities 52a and 52b at its upper and lower surfaces. A first elastomer 53 is insertedly installed at the first cavity 52a, while a second elastomer 54 is insertedly installed at the second cavity 52b.

As shown in the drawings, the second housing 52 is inserted in the opening 51a of the first housing 51, and the contact pin block 55 is insertedly installed between the first housing 51 and the second housing 52.

The contact pin block 55 includes a plurality of contact pins 55a arranged at constant pitches, and a heat adhesive insulating tape 55b attached on one side or on both sides of each contact pin 55a. The insulating tape 55b serves to maintain the constant pitches between each contact pin, to fix the plurality of contact pins so that they can move together at the same time, and to reduce a height deviation of each contact pin.

Accordingly, as to the test socket in accordance with the first embodiment of the present invention, the plurality of contact pins are formed in block, so that the contact pins can be replaced by block when they are possibly defective. Thus, it is much advantageous in that the replacement of the contact pins is easily and speedily made.

In addition, accordingly, only the defective contact pin block is replaced rather than discarding the entire socket, so that its expense can be much saved.

Moreover, since the contact pins are fixed by block at the same pitches by the polyimide tape, not separated one by one, the pitches between each individual contact pin need not be adjusted separately one by one.

The contact pin block 55 is bent in 'C-'shape so as to be contacted with an upper surface, a side wall and a lower surface of the second housing 52. The contact pin block 55 is installed by being simply inserted from the side of the second housing 52, the way like inserting a clip, thus, the replacement of a defective contact pin is quite easy.

Figure 6A:
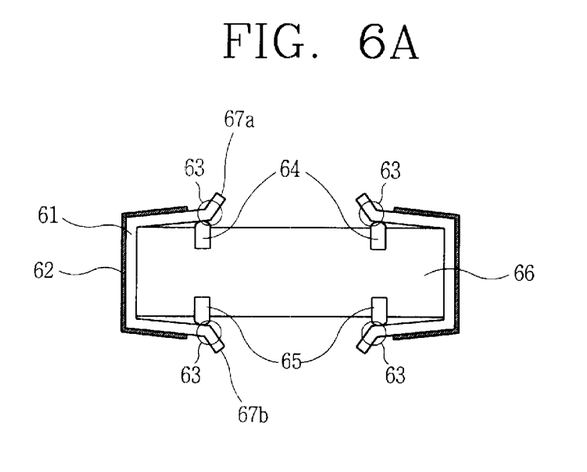
FIGS. 6A through 6C are sectional view showing various modifications of the contact pin for the test socket in accordance with the present invention.
Figure 6B:
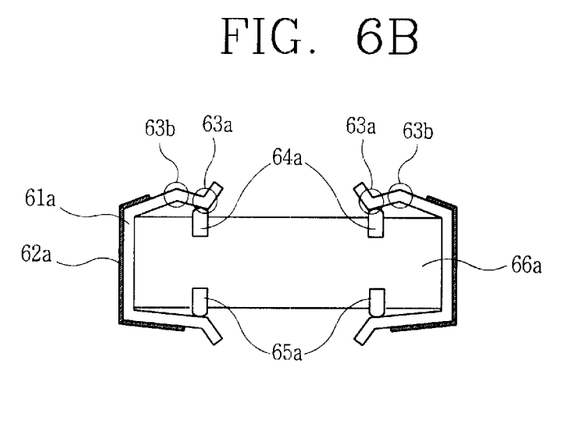
Figure 6C:
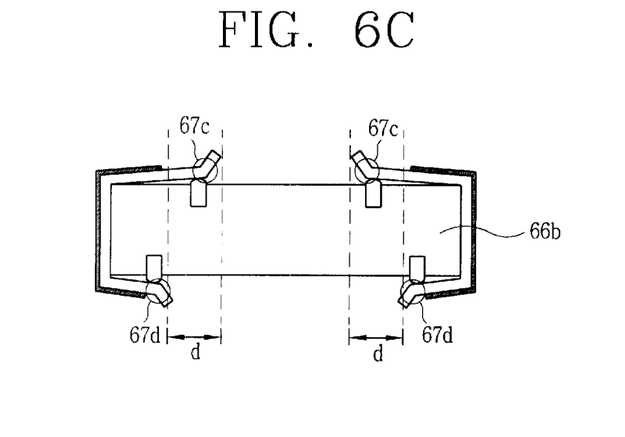

The contact pin is changeable in various shapes as shown in FIGS. 6A through 6C.

FIGS. 6A through 6C are sectional view showing various modifications of the contact pin for the test socket in accordance with the present invention.

First, as shown in FIG. 6A, the contact pin 61 is bent once at a portion where it is exposed outwardly from the insulating tape 62, and the end portion of the contact pin 61 is bent in the outward direction of the housing 66. The contact pin 61 is mounted to contact the upper surface of the elastomers 64 and 65 in the vicinity of the bent portion 63. Specially, the inside of the contact pin, that is, the opposite side to the end of the contact pin on the basis of the bent portion, contacts the elastomers 64 and 65. A first end 67a positioned at the upper surface of the housing 66 of the contact pin 61 and a second end 67b positioned at the lower surface of the housing 66 are formed in the same vertical line as taken.

As shown in FIG. 6B, the contact pin 61a is bent twice at a portion where it is exposed outwardly from the insulating tape 62a, of which each bent portion 63a and 63b are bent in the opposite direction to each other. The bent portion 63a contacts the elastomers 64a and 65a installed at the upper and lower surfaces of the housing 66a, respectively.

As shown in FIG. 6C, the upper end portion 67c positioned at the upper surface of the housing 66b of the contact pin 61b and the lower end portion 67d positioned at the lower surface of the housing 66b may be formed in a manner that the lower portion 67d is shorter as long as the distance 'd' in the horizontal direction than the upper portion 67c, or vice versa, rather than being formed in the same vertical line as taken.

Namely, the upper end portion (which is connected to an outer lead of the device under test in testing) and the lower end portion (which is connected to a circuit of the printed circuit board in testing) of the contact pin may be in the same vertical line as taken in the up/down direction or may have a difference as long as the distance 'd' or more in the horizontal direction. In other words, respective position of the upper end portion and the lower end portion may be suitably designed in order to fit an external terminal of the device under test to be connected thereto or the circuit pattern formed on the printed circuit board.

Accordingly, by adjusting the length of the contact pin of the contact pin block, the test socket in accordance with the present invention can be readily applied to various kinds of test equipment having printed circuit boards in different shapes and in different sizes.

In addition, as to the test socket structure in accordance with the present invention, when the device under test is pressed by the pressing pressure in testing, since the lower end portion of the contact pin and the circuit pattern of the printed circuit board are connected to each other by the downward pressing pressure in the up/down direction, without occurring movement in the horizontal direction, the circuit pattern of the printed circuit board won't be abraded, which preserves the durability of the board of the test equipment by preventing the circuit pattern on the printed circuit board from shorting.

Figure 7A:
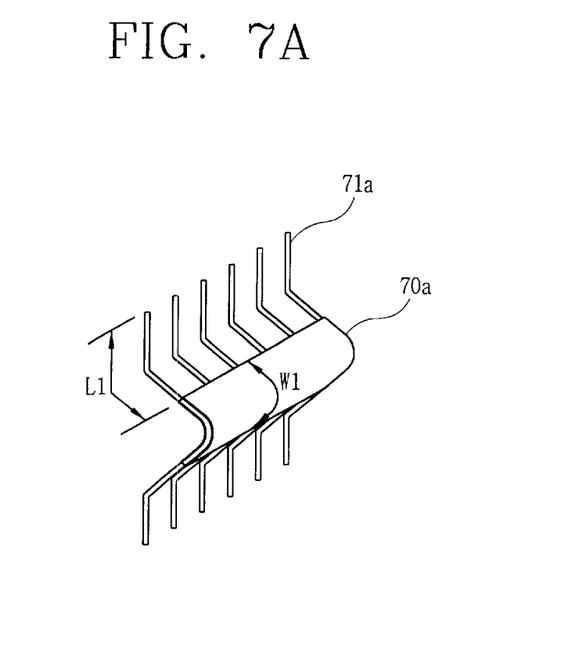
FIGS. 7A and 7B are outer perspective views of a contact pin block in accordance with the present invention.
Figure 7B:
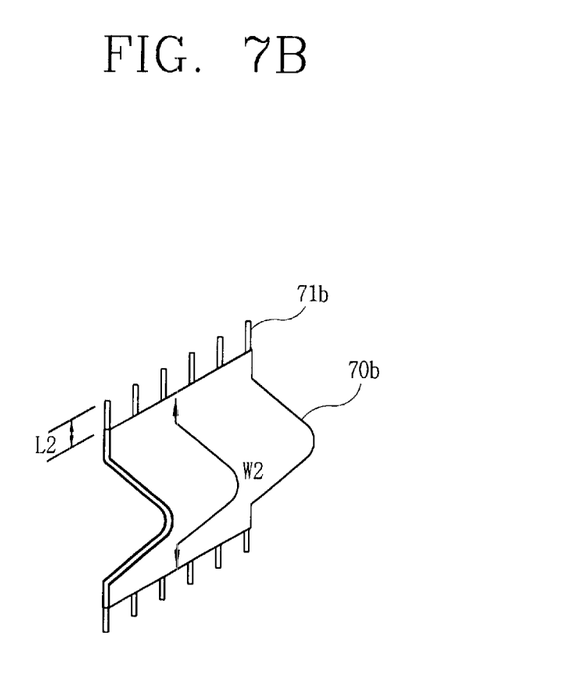

As shown in FIGS. 7A and 7B, as to the contact pin block in accordance with the present invention, an elasticity of the contact pin can be controlled by adjusting the lengths L1 and L2 of the contact pins 71a and 71b exposed outwardly of the insulating tapes 70a and 70b.

In detail, the shorter the lengths L1 and L2 are, the stronger the elasticity (spring elastic force) is, while the longer the lengths L1 and L2 are, the weaker the elasticity is. Accordingly, the width of the insulating tapes 70a and 70b can be controlled to have a suitable elasticity in testing, in consideration of a contact resistance between the external terminal of the device under test and the end portion of the contact pin, the strength of the downward pressure and the electric characteristics of the test circuit.

Fabricating method of the contact pin for a test socket in accordance with the present invention will now be described with reference to FIGS. 8A through 8C.

Figure 8A:
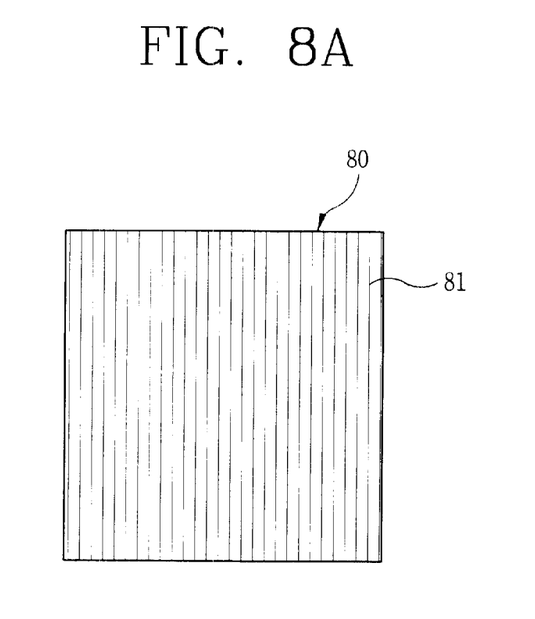
FIGS. 8A through 8C shows the order of fabricating process of the contact pin for test socket in accordance with the present invention.

First, as shown in FIG. 8A, a metal substrate having metal grains (formed in extrusion) in a constant direction is formed.

Figure 8B:
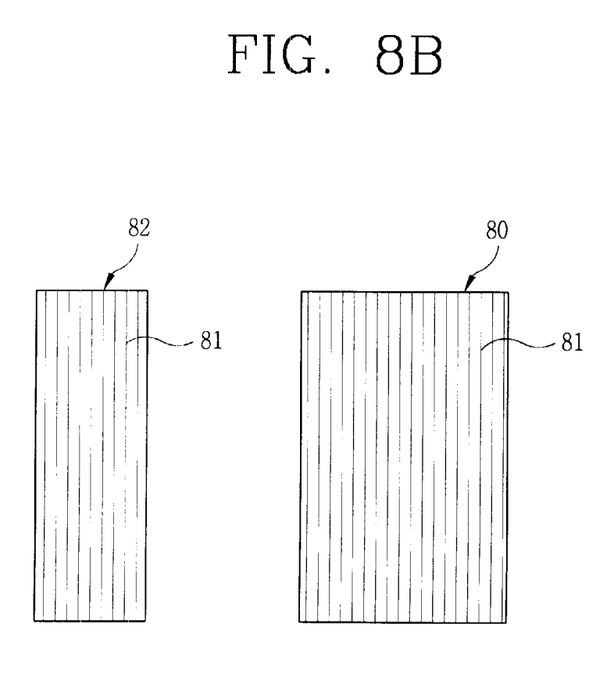

Then, as shown in FIG. 8B, the metal substrate 80 having a predetermined width is cut in the grain direction to form a metal strip 82.

Figure 8C:
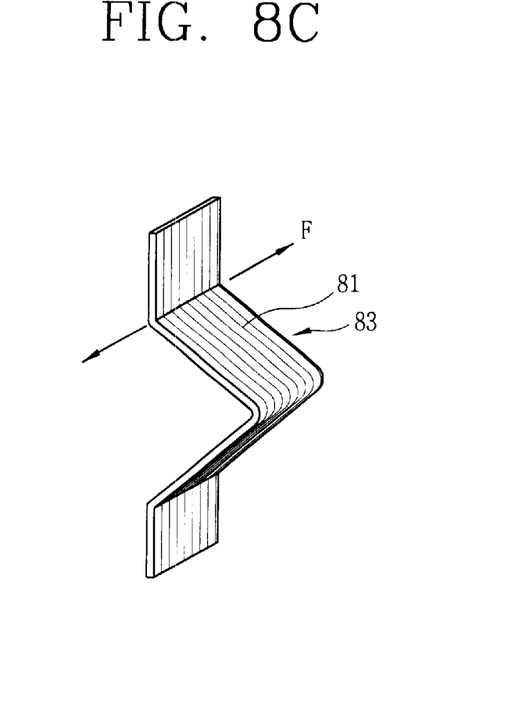

Next, as shown in FIG. 8C, the metal strip 82 is bent or curved in the 'f' direction perpendicular to the direction of the metal grain 81 to form a contact pin 83.

And then, the plurality of contact pins formed by bending or curving the metal strips are arranged at constant pitches and an insulating tape is attached onto one side or onto the both sides thereof, to thereby fabricating the socket pin block to be used for the socket of the present invention.

As described above, in case that the metal plate is cut in the grain direction of the metal, which is then bent or curved in the direction perpendicular to the grain direction to form the contact pin, deformation or breakdown of the bent or curved form due to fatigue of the material would hardly occur even if the socket contact pin would be used for a long time, so that the durability of the socket pin is prolonged.

A test socket structure of a multi-chip module device in accordance with a second embodiment of the present invention will now be described with reference to FIGS. 9A through 9C.

Figure 9A:
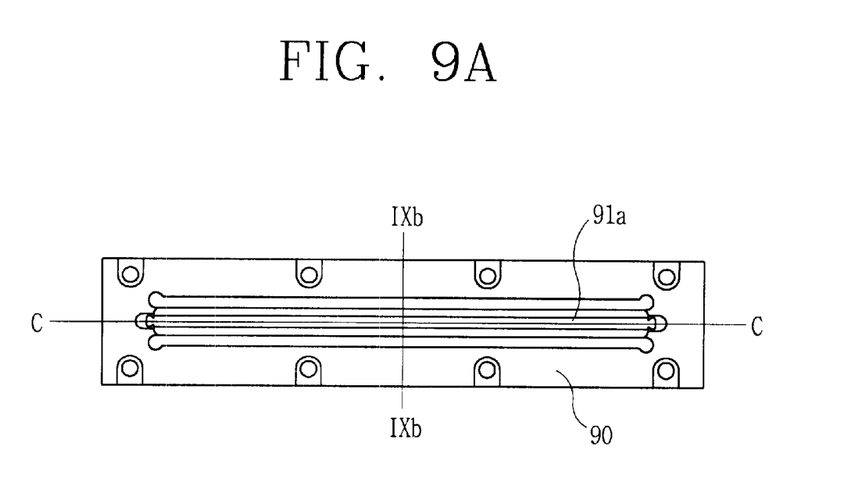
FIG. 9A is a plan view of a test socket in accordance with a second embodiment of the present invention.
Figure 9B:
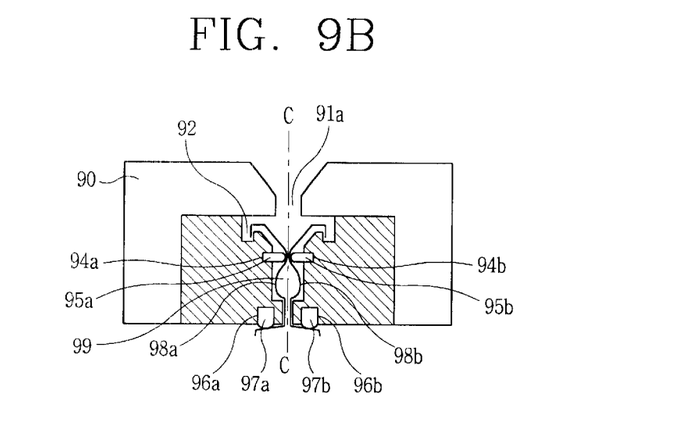
FIG. 9B is a longitudinal-sectional view of the test socket taken along line IXb—IXb of FIG. 9A in accordance with the present invention.
Figure 9C:
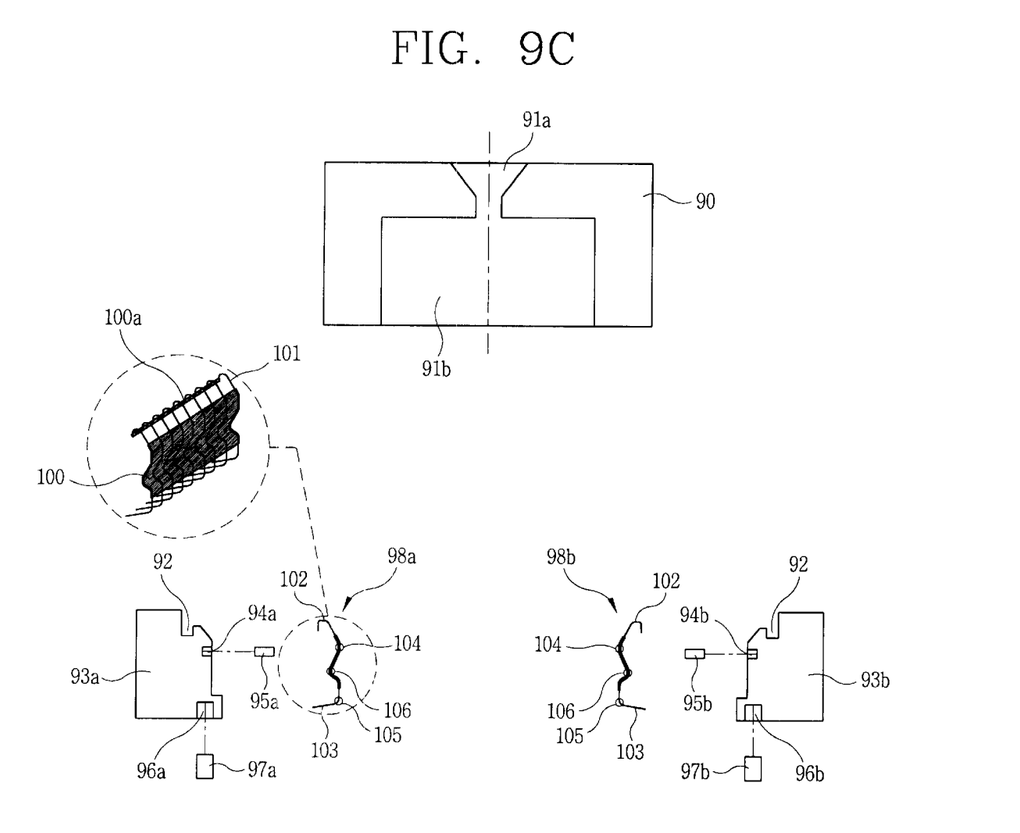
FIG. 9C is a sectional view of each element of FIG. 9B as disassembled in accordance with the present invention.

FIG. 9A is a plan view of a test socket in accordance with a second embodiment of the present invention; FIG. 9B is a longitudinal-sectional view of the test socket taken along line IXb—IXb of FIG. 9A in accordance with the present invention; and FIG. 9C is a sectional view of each element of FIG. 9B as disassembled in accordance with the present invention.

A test socket in accordance with the second embodiment of the present invention is applicable in case where the device under test is a multi-chip module. The test socket includes a slit 91a at the central portion of its upper surface through which an outer lead of the device under test is taken in and drawn out, and a first housing 90 having a receiving recess 91b where a supporting unit for supporting a contact pin block is mounted at the center thereof. The slit 91a and the receiving recess 91b are connected to each other.

The contact pin supporting unit is inserted by being divided to a left supporting unit 93a and a right supporting unit 93b in the receiving recess 91b.

The left and right supporting units 93a and 93b respectively have a slot 92 at a predetermined upper portion where the upper end portion of the contact pin is taken in.

The left and the right supporting units 93a and 93b are respectively formed with a narrower upper side and wider lower side. As a result, a cavity 99 is formed between the left supporting unit 93a and the right supporting unit 93b at the upper side narrower than the lower side, while the left supporting unit 93a and right supporting unit 93b almost come to contact at the lower side.

First cavities 94a and 94b are respectively formed at each side wall of the left and the right supporting units 93a and 93b, and first elastomers 95a and 95b are respectively inserted into the first cavities 94a and 94b. The first elastomers 95a and 95b formed protrusive outwardly more than the side wall of the left and right supporting units 93a and 93b.

Second cavities 96a and 96b are respectively formed at the surface of the left and the right supporting units 93a and 93b, and second elastomers 97a and 97b are respectively inserted into the second cavities 96a and 96b. The second elastomers 97a and 97b are formed protrusive somewhat downwardly from the lower surface of the supporting units.

Left and right contact pin blocks 98a and 98b are installed between the left and the right supporting units 93a and 93b.

The right and left contact pin blocks 98a and 98b respectively include a plurality of contact pins 100 arranged at predetermined pitches and an insulating tape 101 attached on one side or both sides of each of the plurality of contact pins 100.

The plurality of contact pins attached on the insulating tape 101 are made of block so as to be moved together. Accordingly, if some contact pins are defective during the testing, they are replaced by block as attached on the insulating tape 101.

The end portions of the contact pins 100 are connected by narrow insulating linear tapes 100a, respectively. When the contact pin block having the thin contact pins at narrow pitches is fixed to the left and right supporting units, the linear tapes 100a serves to prevent the pitches between contact pins from widening at the upper end portion of the contact pins, or prevent a short between the contact pins possibly caused when the pitches therebetween become too narrow.

The upper end portion 102 of the contact pins 100 of the contact pin block is bent in hook shape, and its marginal portion of the upper end portion 102 is inserted into the slot 92 of the left and right supporting units 93a and 93b.

As the contact pin blocks are mounted at the left and right supporting units and then inserted into the first housing 90, the upper end portion 102 of the contact pins is positioned below the first housing 90. Accordingly, since the upper end portion 102 of the contact pins 100 is positioned inside the housing rather than being exposed outside, the contact pins would be hardly deformed due to any external source when the device under test is taken in and drawn out. Therefore, the durability of the socket contact pin is lengthened.

Each contact pin 100 is bent at least twice, having a first bent portion 104 and a second bent portion 105. The first bent portion 104 is formed near the upper end portion 102 of the contact pin 100, while the second bent portion 105 is formed near the lower end portion 103 of the contact pin 100. The first bent portion 104 is bent to be convex toward outside of the side wall of the left and right supporting units, of which vertex is positioned in the central line C—C of the socket, that is, in the same vertical line as the slit.

The first bent portion 104 of the contact pins of the left contact pin block 98a contacts the first elastomer 95a installed at the left supporting unit 93a, while the first bent portion 104 of the right contact pin block 98b contacts the first elastomer 95b installed at the right supporting unit.

The first bent portion of the contact pin of the left contact pin block and the first bent portion of the contact pin of the right contact pin block are closed to each other in a facing manner.

During testing, the outer lead of the device under test is inserted between the first bent portions of the left and right contact pins. In detail, when the outer lead of the device under test is inserted, the left and right contact pin blocks are open as the first bent portion of the left and right contact pin block is pushed outwardly of the central line, and when the outer lead of the device under test is taken out, they are attached.

Generally, in most cases, as the testing is repeatedly done, the elasticity of the first bent portion is weakened, deteriorating a reliability of the electric connection between the outer lead of the device under test and the contact pin.

However, according to the above described present invention, since the elastomer is installed between the bent portion of the contact pin block and the side wall of the supporting unit, which prevents an instability in the connection between the outer lead of the device under test and the contact pin normally caused as the elasticity (spring elastic force) at the bent portion of the contact pin becomes weak.

Also, unlike the point contact method of the conventional art, wider area of the outer lead of the device under test contacts the contact pin, so that the stability in the electric connection between the contact pin and the outer lead is quite improved.

The second bent portion 105 is formed at a lower corner side of the left and right supporting units 93a and 93b, and the lower end portion 103 of the contact pin is protruded outwardly of the left and right supporting units 93a and 93b.

The lower end portion 103 of the contact pin 100 is positioned at the lower surface of each of the left and right supporting units 93a and 93b, and specially, contacts the second elastomers 97a and 97b installed at the lower surface of the left and right supporting units 93a and 93b.

Accordingly, even though up and down movement of the contact pin is repeated while the test is repeatedly done, the elasticity at the portion where the lower end portion 103 contacts the printed circuit of the printed circuit board is constantly maintained. Also, since the height deviation of the lower end portion 103 of the contact pins is even, thereby obtaining a reliability in the connection between the printed circuit and the contact pin.

The contact pin 100 may form a third bent portion 106 between the first bent portion 104 and the second bent portion 105.

In testing, the lead pin of the device under test is inserted between the first bent portions 104 of the left and right contact pin blocks 98a and 98b so as to be connected to the contact pins of the socket. At this time, when the device under test is pressed by a downward pressure at the same time when the lead pin of the device under test is inserted between the first bent portions of the left and right contact pin blocks, the lower end portion 103 of the contact pin is connected to the printed circuit of the test equipment.

Likewise in the first embodiment of the present invention, the test socket in accordance with the second embodiment of the present invention is advantageous in that since the contact pin is formed in block by attaching the polyimide tape on the plurality of contact pins, when any contact pin of the test socket is defective, it can be easily replaced by block. Also, the elasticity of the contact pin can be readily controlled by changing the length of the contact pin exposed outside of the polyimide tape. In addition, the height deviation between each contact pin can be reduced. Moreover, the elastomers for preventing the elasticity of the contact pin from weakening are provided at the position where the outer lead of the device under test is inserted to be connected, so as to thereby prevent the durability of the contact pin from shortening. Also, in fabricating the contact pin, since the metal plate is cut in the grain direction of the metal and is bent or curved in the direction perpendicular to the grain direction, the spring elastic force of the contact pin is hardly weakened or deformed.

Figure 10A:
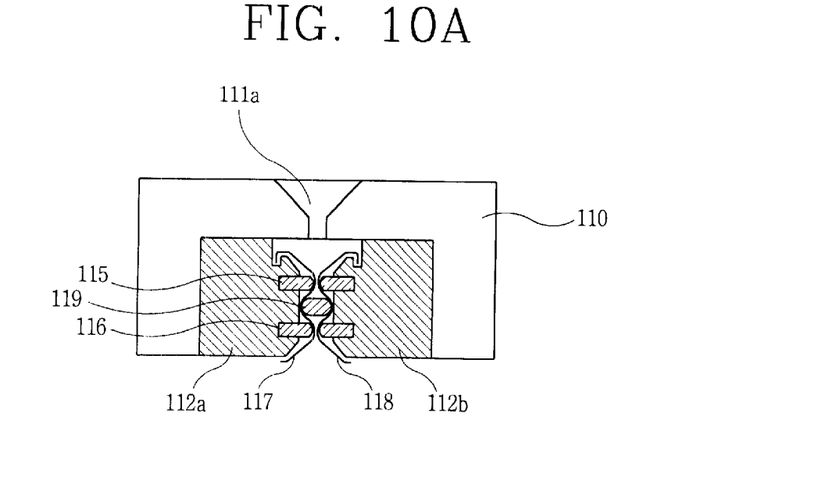
FIG. 10A is a sectional view of test socket in accordance with a third embodiment of the present invention.
Figure 10B:
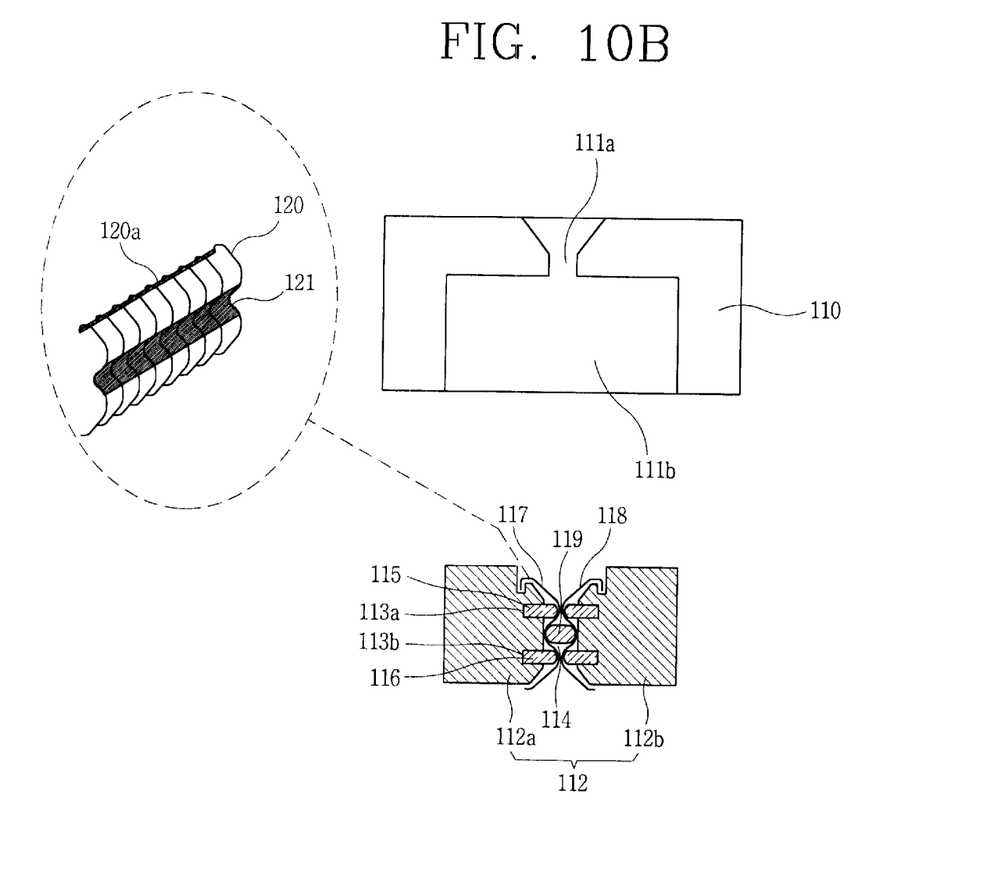
FIG. 10B is a sectional view of each element of FIG. 10A as disassembled in accordance with the present invention.

FIG. 10A is a sectional view of test socket in accordance with a third embodiment of the present invention; and FIG. 10B is a sectional view of each element of FIG. 10A as disassembled in accordance with the present invention.

A test socket in accordance with a third embodiment of the present invention also has a structure for testing a multi-chip module device. Specially, it is applicable to the case where a board of the test equipment is a vertical-type printed circuit board.

The test socket of the third embodiment of the present invention includes a slit 111a at the central portion of its upper surface, through which an outer lead of a device under test is taken in and drawn out, and a first housing 110 having a receiving recess 111b at the central portion of its lower surface. The slit 111a and the receiving recess 111b are connected to each other.

A contact pin supporting unit 112 is inserted into the receiving recess 111b. The contact pin supporting unit 112 is divided to a left supporting unit 112a and right supporting unit 112b, between which a contact pin block is installed.

A first cavity 113a and a second cavity 113b formed at each side wall at the side where the left and right supporting units 112a and 112b are contacted to each other. The first cavity 113a and the second cavity 113b are formed at the upper and lower sides of the side wall at a predetermined space.

A first elastomer 115 in insertedly installed in the first cavity 113a formed at the upper side of the side wall and protruded outwardly of the side wall, while a second elastomer 116 is insertedly installed in the second cavity 113b and protruded outwardly of the side wall.

The side walls of the left supporting unit and the right supporting unit are in the corresponding same shape, and each first elastomer 115 formed at each side wall thereof contacts and each second elastomer 116 thereof contacts.

A left and a right contact pin blocks 117 and 118 having a curve along the shape of the side wall are installed at the side wall of the left and right supporting units 112a and 112b.

In detail, the contact pin blocks 117 and 118 respectively have a curve convex outwardly of the side wall of each supporting unit at the portion where they contact the first and the second elastomers and respectively have a curve concave so as to be near the side wall of the supporting unit at the central part between the first and the second elastomers. Accordingly, the left contact pin block and the right contact pin block contact each other in a facing manner at each of the convex bent portion.

A spacer 119 made of an insulating material is installed between the left contact pin block 117 and the right contact pin block 118 at a portion where the left and right contact pin blocks 117 and 118 are bent concave. The insulating spacer 119 renders the left and right contact pin blocks 118 and 119 of the contact pins to be fixed to the left and right supporting units, respectively, and prevents the contact pin block from dismounting from the supporting unit or releasing from its own position.

The contact pin blocks 117 and 118 respectively include a plurality of contact pins 120 and a polyimide tape 121 attached on one side of both sides of each of the contact pin.

An insulating linear tape 121a connects the marginal portion of the upper portion of the contact pins 120. The linear tape 121a serves to maintain the pitch between each contact pin to be constant and prevent a short from occurring possibly caused when the pitches between the contact pins become narrow.

According to the test socket of the present invention, even though the lead pin of the device under test is repeatedly inserted and taken out hundreds and thousands times at the portion where the left and right contact pins contact each other for testing, since there exist an elastomer 114 between the side wall of the contact pin supporting units 112a and 112b and the contact pin block, the elasticity of the contact pin is constantly maintained, thereby preventing the contact inferiority of the lead pin in testing.

As so far described, the test socket of the present invention has advantages in the following aspects.

First, even though testing is repeatedly done hundreds and thousands times, since the contact pin of the test socket repeatedly moves up/down directions, the printed circuit is hardly abraded.

Secondly, when there is a defective contact pin in the socket, the only contact pin in question is replaced by a normal one, without necessity of replacing the socket itself, so that the expense for testing of the semiconductor device is reduced.

Thirdly, since the plurality of contact pins are attached on the insulating tape to form a block, when there is a defective contact pin, the contact pin can be replaced by block, resulting in that the replacement of the contact pin is easy and speedy.

Fourthly, the elastomer is installed at the portion where the housing and the contact pin contact at the both end portions of the contact pin, so as to maintain the spring elastic force of the contact pin. Meanwhile, since the height deviation of each contact pin becomes even owing to the elastomer, the electric connection between the socket contact pin the outer lead of the device under test in testing is much stabilized.

Fifthly, since the socket in accordance with the present invention is used by being fixed to the printed circuit board of the test equipment, the electric connection between the contact pin of the socket and the printed circuit of the printed circuit board is much stabilized, and also the connection resistance is much reduced.

Lastly, in fabricating the contact pin of the socket, since it is formed bent or curved in the direction perpendicular to the grain of the metal plate, the contact pin is hardly deformed, so that the durability of the contact pin is lengthened.

It will be apparent to those skilled in the art that various modifications and variations can be made in the plasma polymerization on the surface of the material of the present invention without departing from the spirit or scope of the invention. Thus, it is intended that the present invention cover modifications-and variations of this invention provided they come within the scope of the appended claims and their equivalents.

What is claimed is:

1. A test socket comprising:
   a first housing made of an insulating material having an opening at its central portion;
   a second housing made of an insulating material and insertedly installed at the opening of the first housing;
   a first and a second elastomers respectively installed at an upper and a lower surfaces of the second housing; and
   a contact pin block comprising: a plurality of metal strips arranged at constant pitches and bent in a direction perpendicular to a grain direction on a metal plate, and an insulating tape attached onto one side or both sides of the metal strips, the metal strips having grains in a constant direction thereon in the grain direction,
   wherein the contact pin block is installed between the first and the second housings and is contacted with the first and the second elastomers in the vicinity of both end portions of the contact pin.

2. The test socket according to claim 1, wherein the contact pin block is bent in 'C' shape and inserted into the first housing so as to contact the upper surface, side and lower surface of the first housing.

3. The test socket according to claim 1, wherein the contact pin block is formed by a plurality of contact pins arranged at constant pitches, one side of both sides of which being attached on an insulating tape having an even width.

4. The test socket according to claim 3, wherein the lengths of each contact pin exposed outside of the insulting tape of the contact pin block are even.

5. The test socket according to claim 3, wherein the contact pins of the contact pin block respectively have at least one bent portion at the part exposed outside of the insulting tape.

6. The test socket according to claim 5, wherein the contact pins are installed to contact the first elastomer or the second elastomer in the vicintiy of the bent portion.

7. The test socket according to claim 3, wherein each contact pin is formed by a fabricating method comprising the steps of:
   preparing a metal plate extrusion-molded so as to have grains in a constant direction thereon;
   cutting the metal plate in the grain direction to form a metal strip;

bending or curving the metal strip in a direction perpendicular to the grains to make a contact pin for socket; and arranging the plurality of contact pins at constant pitches and attaching an insulating tape onto one side or both sides of the contact pin to thereby form a contact block.

8. A test socket comprising:

a first housing made of an insulating material having a slit at the central portion of its upper surface and a receiving recess at the central portion of its lower surface;

a left supporting unit and right supporting unit respectively insertedly installed within the receiving slot of the first housing;

a first elastomer protrusively installed both at a side wall of the left supporting unit and at a side wall of the right supporting unit;

a left contact pin block supported by the side wall of the left supporting unit; and a right contact pin block supported by the side wall of the right supporting unit, wherein the left contact pin block and the right contact pin block have respectively at least one bent portion, the contact pins are bent outwardly of each side wall of the left supporting unit and the right supporting unit, and the bent portion of the left contact pin block and that of the right contact pin block are closed to each other, and wherein the contact pin block comprises; a plurality of metal strips arranged at constant pitches and bent in a direction perpendicular to a grain direction on a metal plate, and an insulating tape attached onto one side or both sides of the metal strips, the metal strips having grains in a constant direction thereon in the grain direction.

9. The test socket according to claim 8, wherein the first elastomer is positioned between the side wall of the left side supporting unit and the bent portion of the left side contact pin block, and between the side wall of the right supporting unit and the bent portion of the right contact pin block.

10. The test socket according to claim 8, wherein a cavity is formed at a lower surface of the left and right supporting units, the second elastomer is inserted in the cavity, and the lower end portion of the contact pin of the contact pin block contacts the second elastomer.

11. The test socket according to claim 8, wherein a slot is formed on the upper surface of each of the left and right supporting units, and the marginal portion of the contact pin is positioned inside the slot.

12. The test socket according to claim 8, wherein the left and right contact pin block includes:

a plurality of contact pins arranged at constant pitches; and an insulating tape attached on one side or both sides of each of the contact pins.

13. The test socket according to claim 12, wherein the marginal portions of the contact pins are connected by the insulating linear tape.

14. The test socket according to claim 12, wherein each contact pin is formed by a fabricating method comprising the steps of:

preparing a metal plate extrusion-molded so as to have grains in a constant direction thereon;

cutting the metal plate in the grain direction to form a metal strip;

bending or curving the metal strip in a direction perpendicular to the grains to make a contact pin for socket; and arranging the plurality of contact pins at constant pitches and attaching an insulating tape onto one side or both sides of the contact pin to thereby form a contact block.

15. A test socket comprising:

a first housing made of an insulating material having a slit at the central portion of its upper surface and a receiving recess at the centrall portion of its lower surface;

a right supporting unit and left supporting unit respectively insertedly installed within the receiving slot of the first housing;

a first and a second elastomers respectively protrusively installed at an upper side and a lower side of each side wall at a predetermined interval;

a left contact pin block supported by the side wall of the left supporting unit; and a right contact pin block supported by the wall of the right supporting unit, wherein the left contact block and the right contact block have two convex bent portions formed convexly in the distanced direction from the side wall and a concave bent portion formed between the convex bent portions and bent in the adjacent direction to the side wall of the supporting unit, and each convex bent portion of the right contact pin block and the left contact pin block closes to each other and wherein the contact pin block comprises: a plurality of metal strips arranged at constant pitches and bent in a direction perpendicular to a grain direction on a metal plate and an insulating tape attached onto one side or both sides of the metal strips, the metal strips having grains in a constant direction thereon in the grain direction.

16. The test socket according to claim 15, wherein the convex bent portion contacts the first elastomer or the second elastomer.

17. The test socket according to claim 15, wherein an insulating spacer is installed between the left contact pin block and the right contact pin block at the concave bent portion.

18. The test socket according to claim 15, wherein the left and right contact pin block includes:

a plurality of contact pins arranged at constant pitches; and an insulating tape attached on one side or on both sides of each of the contact pins, wherein marginal portions of the contact pins are connected by an insulating linear tape.

* * * * *